United States Patent [19]

McClaskey

[11] 3,949,304
[45] Apr. 6, 1976

[54] FRACTIONAL MEGAHERTZ COUNTER FOR IMPROVED DIGITAL SYNTHESIZER
[75] Inventor: Boyd M. McClaskey, Flourtown, Pa.
[73] Assignee: Narco Scientific Industries, Inc., Fort Washington, Pa.
[22] Filed: Jan. 23, 1975
[21] Appl. No.: 543,539

[52] U.S. Cl. .................. 325/421; 331/1 A; 331/18
[51] Int. Cl.² .......................................... H03B 3/08
[58] Field of Search ....... 325/17, 25, 418, 419, 421, 325/422; 328/25, 39, 41, 45, 46, 48; 331/1 A, 14, 18, 34, 40, 51

[56] References Cited
UNITED STATES PATENTS
3,353,104  11/1967  Loposer............................ 328/45 X
3,484,699  12/1969  Israel .................................. 328/46

Primary Examiner—Benedict V. Safourek
Attorney, Agent, or Firm—Paul & Paul

[57] ABSTRACT

A voltage controlled oscillator in a phase locked loop generates signals through the avionics communication band, and the VCO output is divided alternately by first and second factors corresponding to kilohertz range increments, and then by a third factor corresponding to the applicable megahertz increment. The relative time periods during which the respective KHz factors are utilized depends upon the count generated by a logical circuit, operating responsively to encoded representations of channels to be utilized. First and second preloaded counters operate for a predetermined time period, during which both factors are utilized alternatively; during the remainder of the counting cycle, only one factor is utilized.

11 Claims, 2 Drawing Figures

FRACTIONAL MEGAHERTZ COUNTER FOR IMPROVED DIGITAL SYNTHESIZER

BACKGROUND OF THE INVENTION

This invention relates to avionics communication apparatus, and more particularly to logic and control circuitry for regulating division ratios in phase locked loops.

In a patent application by Boyd M. McClaskey and John F. Smith entitled "Improved Digital Synthesizer", filed concurrently herewith and assigned to the assignee hereof, Ser. No. 543,538, there is described a variable division rate phase locked loop useful for communication selection. In accordance with the scheme set forth therein, an output pulse signal from a voltage controlled oscillator is alternately divided by first or second factors prior to phase/frequency comparison, in response to the fractional MHz designation of the communication channel to be utilized.

In another patent application of Boyd M. McClaskey and John F. Smith filed concurrently herewith and assigned to the assignee hereof, entitled "Digital Synthesizer with Improved Coding Arrangement", Ser. No. 543,540, there is described an advantageous binary coding scheme for the decimal representation of the respective channels, for use in conjunction with the dual mode phase locking apparatus of the foregoing concurrently filed application.

SUMMARY OF THE INVENTION

The present invention is directed to control and logic circuitry to control alternate pulse division circuitry in accordance with the above mentioned former concurrently filed application to generate signals corresponding to the channel selected for use. More particularly, a code is preloaded into a counter mechanism which, synchronous with select signals from the phase locked loop, counts through a predetermined portion of a specified counting routine. Depending upon the proportional duration of the operation of the counter, utilizatiion of the respective division factors by the phase locked loop is proportionately determined, and a proper average loop division ratio is established.

In an illustrative embodiment of first electromechanical switch corresponding to a given order of magnitude of the selected channel presets logic circuitry in a first encoder, which is capable of counting through the entire designated order of magnitude, but which because of the presetting operation, only functions through a predetermined portion thereof. A second electro-mechanical switch, representing specified fractions of the order of magnitude represented by the first switch, preloads a second counter which is capable of counting through all fractional designations of the second switch, but which due to the logical presetting operation, only functions for a portion thereof. Both counters are interconnected with one another to provide for a cooperative sequential counting arrangement, and both are clocked by signals from the phase locked loop. For each reference cycle of the phase locked loop, the counters together interate through a predetermined portion of their total counting capacity, during which time a first division factor is utilized in the phase locked loop. During the complimentary portion of the iterative counting capacity of the two counters, different factors are utilized in the phase locked loop.

DETAILED DESCRIPTION

Figure 1:
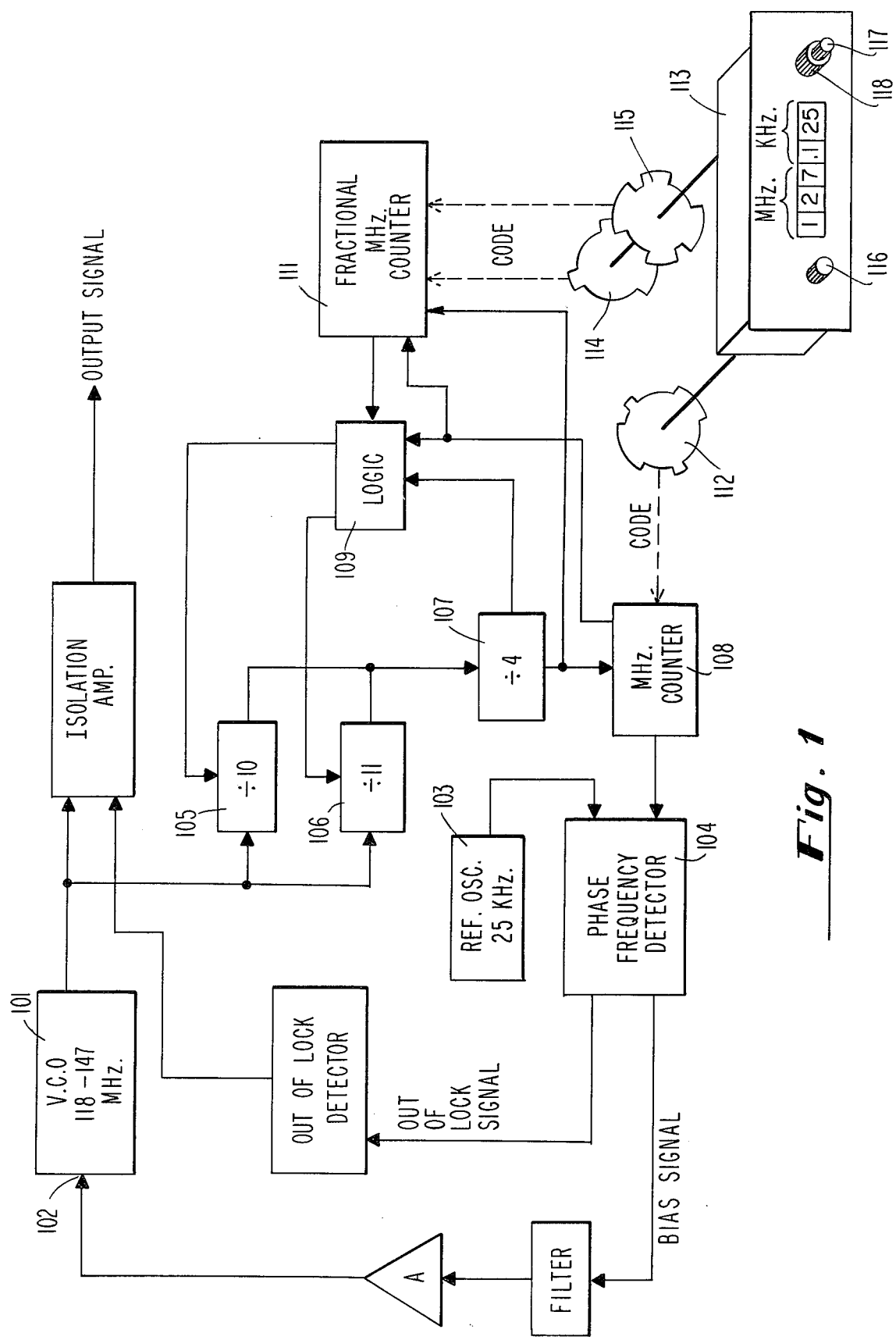
FIG. 1 shows in block diagrammatic form a synthesizer to which the principles of the present invention may advantageously be applied.

In FIG. 1, there is shown a block diagram of a digital synthesizer utilizing multiple mode pulse division (i.e., "pulse swallowing") circuitry. In particular, the embodiment of FIG. 1 includes a phase locked loop such as is described and claimed in the first aforementioned concurrently filed application of Boyd McClaskey and John Smith, Ser. No. 543,538. A voltage controlled oscillator 101 generates signals having a frequency between 118 and 147 MHz, in response to a voltage presented at a control terminal 102. The pulse signal produced by the voltage controlled oscillator 101 is variously divided and is compared with a 25 KHz reference signal from an oscillator 103 at a phase/frequency detector 104. Phase and frequency disparity sensed by the phase detector 104 is translated into a bias signal, which when filtered and amplified is presented to the control terminal 102 of the voltage controlled oscillator 101.

The embodiment of FIG. 1 is designed to operate for avionics communication, and thereby employs respective channels of 25 KHz bandwidth dispersed continuously through the requisite MHz band. Because no even division factor is available conveniently to reduce the voltage controlled oscillator 101 output to a 25 KHz signal for comparison, an alternate frequency division scheme is established, whereby the signals are alternately divided by 40 or 41. That is, they are first divided either by a factor of 10, at pulse counter 105, or by a factor of 11, at pulse counter 106, prior to a division by 4 at pulse counter 107. Thereafter, they are divided by the prevailing MHz increment at pulse counter 108. As set forth in the concurrently filed application, if each cycle of the MHz counter 108 is defined as an epoch, division occurs at counter 105 rather than 106 for a portion of each epoch which is dependent upon the precise frequency of the channel being selected. For the complimentary portion of each epoch, counter 105 is energized for three fourths of each cycle of counter 107, and counter 106 is energized during the remaining quarter of each cycle of counter 107.

As set forth in the block diagram of FIG. 1, the respective times during which divide by 10 counter 105 or divide by 11 counter 106 are employed depends on control signals from a logic circuit 109, which in turn operates responsively to a fractional MHz counter 111, the divide by 4 counter 107, and the MHz counter 108. In turn, the MHz counter is preset in response to a coded signal from a rotary switch 112, the position of which is set by a MHz control knob 116 of a mechanical channel selection apparatus 113. The fractional MHz counter 111 is preset by digital code from rotary switches 114 and 115, which are respectively set by actuating knobs 117 and 118 of the selection apparatus 113. The selection apparatus 113 itself forms the basis of a patent to William Wisser, etal:, entitled "Avionics Channel Selection Apparatus", U.S. Pat 3,879,692, issued Apr. 22, 1975 and assigned to the assignee hereof.

The embodiment of the MHz counter 108 involves counters preset in accordance with the selected MHz designation which operate in accordance with a given code to increment towards a terminal set point code. In turn, pulses from counter 107 are divided appropriately for comparison with 25 KHz reference. Rotary switch 112 in conjunction with the appropriate code provides for the presetting operation. Provision for the fractional MHz (i.e. KHz) counter 111, along with logic 109, in order properly to control alternate division by 40 and 41 (considering the aggregate of division counters 105, 106, and 107) gives rise to the principles of the present invention.

Figure 2:
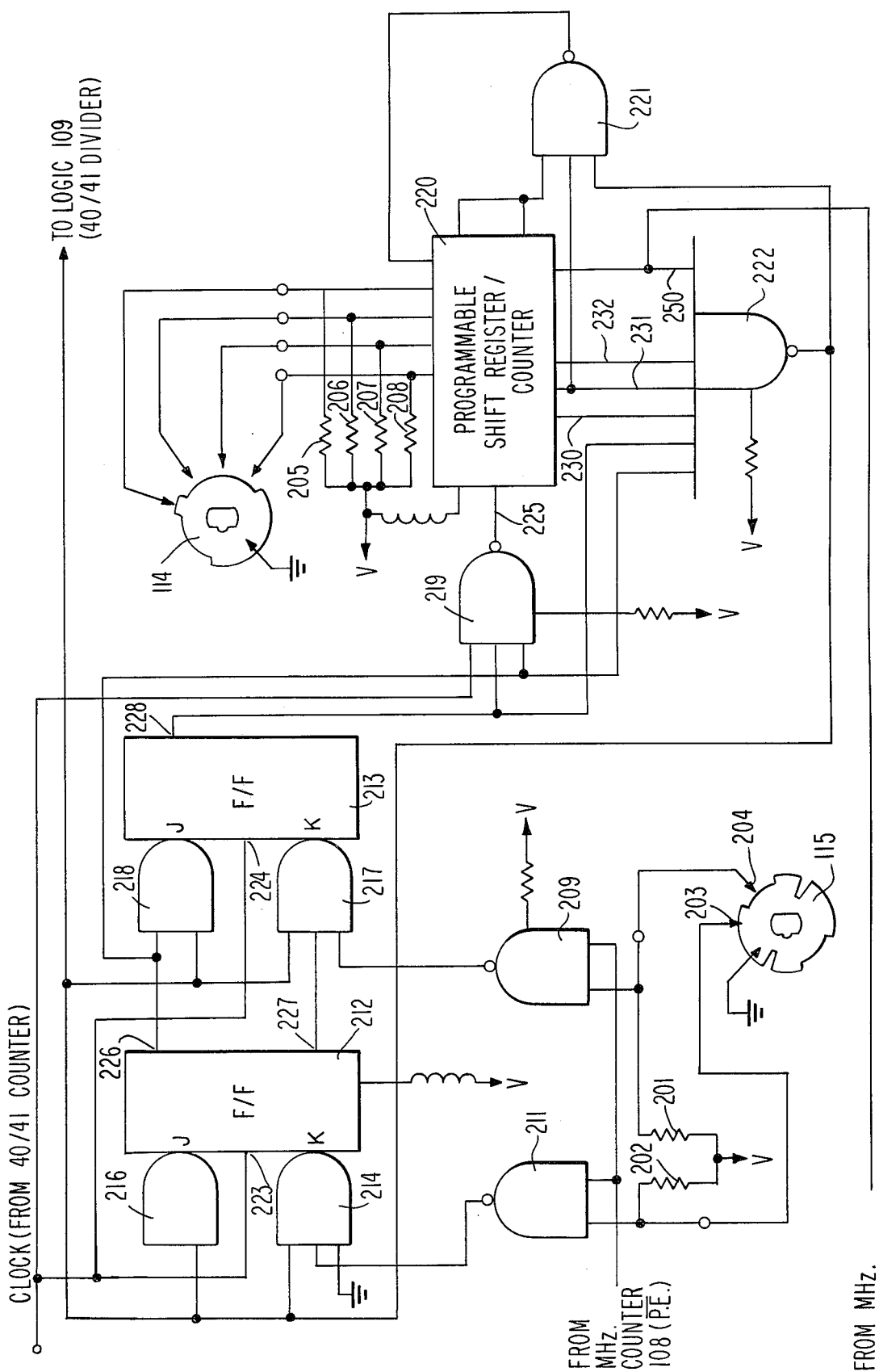
FIG. 2 shows a logic circuit presenting an illustrative embodiment of the principles of the present invention.

A logic and counting circuit is set forth in FIG. 2 which embodys a fractional MHz counter in accordance with the principles of the present invention. Basically, the embodiment of FIG. 2 constitutes two inter-related counters, a first one including flip flops 212 and 213, and a second one including a programmable shift register-counter 220. The counters utilize the pulse signal from the divide by 4 counter 107 (i.e. the divided signal from the 40/41 counter) for clocking purposes. The first counter, including flip flops 212 and 213 is actuated by encoded representations from the lower postion KHz designating switch 115, and therefore is capable of incrementing through four possible counting states in correspondence with possible states in the lower KHz range (i.e. 0, 25, 50 or 75). The second counter 220 operates in response to coded representations of the hundred KHz component of the selected channel, and therefore has a counting range of ten coded counting increments (i.e. 0 through 0.9).

The general operation of the FIG. 2 embodiment is as follows. The first counter including flip flops 212 and 213 serves as a lower case counter, upon the completion of each cycle of which the upper case counter 220 is incremented by one through operation of a NAND gate 219. Since both counters receive clock pulses from the 40/41 counter, and since the aggregate of all counting possibilities for both counters taken together includes one position for each of the KHz possibilities for a selected channel, the aggregate operation of both counters is capable of a complete coded 0 to 39 counting cycle during each epoch of the comparison signal in the phase locked loop. Some or all of that counting time is utilized depending upon the KHz level of the channel selected. That is, any channel selected may have KHz designation between 000 and 975, each of which corresponds to a different aggregate count of the two counters. Switches 114 and 115, with their attendant logic and in accordance with the selected code, preset the counters 212–213 and 220 such that counting is commenced at the increment of the counting cycle which corresponds to the KHz designation of the selected channel. Hence, under the stimulus of clock pulses from the divide by 4 counter 107, counting progresses from the preset point through the balance of a coded regular incremental progression to a coded terminal setpoint. During the time in which counting is progressing, a NAND gate 222 which is responsive to both counters and to other signals, to be discussed hereinafter, transmits a "high" or logical "1" state back to the 40/41 divider, thereby indicating that the divide by 41 mode should be utilized. After the set point is reached, and for the remainder of the epoch, the output of the NAND gate 222 is "low" or a logical "0" which then transmitted to the 40/41 divider indicates that the divide by 40 mode should be utilized. Initiation and termination of each epoch is noted by appropriate signals from the MHz counter 108 (as shown in FIG. 2, a state PE is energized upon termination of each MHz count, and a converse state $\overline{PE}$ is established during other such times). Therefore, the interaction of the counters of FIG. 2 establishes, in proportion to the KHz designation of the selected channel, complimentary proportions of each epoch during which divide by 40 or divide by 41 modes are to be utilized in the phase locking process.

A somewhat more detailed presentation of the logic follows. The function of the lower case programmable counter including a pair of JK flip flops 212 and 213 is to commence counting at a coded point corresponding to the lower double digit KHz designation (0, 25, 50 or 75), and from that point complete and repeat full four position counting cycles until the designated portion of the epoch has been completed. Accordingly, terminals 203 and 204, biased to a voltage supply by resistors 201 and 202, sense the coded representation of the latter two digits for the selected channel. Since counting is to continue until the MHz counter reaches its terminal count, the code from switch 115 is coupled with the signal $\overline{PE}$ from counter 108, indicating that the MHz terminal count has not been reached, into a pair of NAND gates 209 and 211. The output from gates 209 and 211 are respectively fed to AND gate inputs 217 and 214 at the K inputs of flip flops 213 and 212. The clocking inputs 223 and 224 of flip flops 212 and 213 are energized by pulses from the 40/41 counter (i.e. from divide by 4 counter 107 of FIG. 1). The fed back logic signal from NAND gate 222 to the 40/41 divider via logic circuit 109, which as set forth above indicates which mode is to be utilized, is coupled to all four AND gate inputs 214 through 218 of the flip flops 212 and 213. This conveniently serves as a locking mechanism to prevent the counter from operating when gate 222 is disabled after completion of counting through the desired proportion of the current epoch. Output terminals 226 and 227 of the first flip flop 212 are also passed to the AND gate inputs 217 and 218 of the second flip flop 213. Thus, for each complete counting cycle of the lower case counter, that is for each complete cycle of the divide by 4 counter 107, output terminals 226 and 228 of flip flops 212 and 213 are both in the high or logical 1 state. This occurs twenty-five percent of the time on a periodic basis. When terminals 226 and 228 are both logical 1's, all three inputs to NAND gate 219 are energized, and a logical 0 is coupled to the clocking input terminal 225 of the programmable shift register-counter 220. Hence, the lower case counter, including flip flops 212 and 213 with their attendant logic, energizes a shift or coded counting increment in the upper case counter 220 once for every completed cycle of the lower case counter.

The upper case counter 220, which is conveniently embodied as a commercially available Fairchild 9300 integrated circuit, functions similarly to the lower case counter 212 and 213. In fact, it is configured similarly to the lower case counter, but includes four, rather than two stages to account for 10 code combinations. Brushes in the proximity of the rotary switch 114, biased appropriately by resistors 205 through 208, serve the function of preprogramming the counter 220. Thereupon, in clocked relationship to the output of the lower case counter and the divide by 40/41 counter via gate 219, the upper case counter increments itself through a prescribed portion of its potential counting span.

An advantageous code allocation for the upper case counter 220 is as follows:

| Frequency (MHz) | Initial State |
|---|---|
| .0 | 1110 |
| .1 | 1101 |
| .2 | 1011 |
| .3 | 0110 |
| .4 | 1100 |
| .5 | 1000 |
| .6 | 0000 |
| .7 | 0001 |
| .8 | 0011 |
| .9 | 0111 |

An advantageous code allocation for the lower case 212 and 213 is as follows:

| Frequency (KHz) | Initial State |
|---|---|
| 0 | 11 |
| 25 | 01 |
| 50 | 10 |
| 75 | 00 |

Both codes result from the FIG. 2 logic configurations, the counter 220 code resulting from the feedback gate 221. From the designated initial state, the counter increment as previously described to the terminal states, 11 for the lower case counter (at terminals 226 and 228) and 1110 for the upper case counter (the 111 portion being coupled to gate 222 at terminals 230, 231 and 232).

Thus, together the two counters function to increment from their respective pre-programmed initial starting points, and, by appropriate shifting, increment toward the terminal points (i.e., 0.000 MHz, or 11 1110). While the process proceeds, the output of gate 222 is high, or a logical 1, and the "pulse swallowing" divide by 41 condition is energized. When the terminal count is reached, gate 222 goes low, and a divide by 40 condition is energized.

Also, when gate 222 is low, the counters are "jammed" by way of input gates 214 and 216 of flip flops 212 and 213, until a MHz counter terminal state change once more starts the process via terminal 250 of gate 222.

It is to be understood that the embodiments described herein are illustrative of the principles of the present invention but that numerous alternative embodiments may occur to those with ordinaray skill in the art without departure from the spirit or the scope thereof.

We claim:

1. In a communication channel synthesizer employing a phase locked loop which utilizes first and second alternate division rates during each phase comparison epoch, apparatus for controlling the duration of utilization of each of said rates in response to mechanical channel selection means, comprising:
   means, responsive to said selection means, for developing a digitally coded representation of the frequency of the selected channel;
   counting means, functional in correspondence with a fractional segment of the channel range of said synthesizer, increments of said counting means being associated with channels within said fractional segment, said counting means being incremented, by pulses from said loop, between said coded representation and a predetermined set point associated with an extremity of said fractional segment; and
   logic means, responsive to said loop and to said counting means, for selectively actuating said alternate rates for respective complementary time periods during each epoch, a first rate being energized while said counting means is incrementing between said representation and said set point, and a second rate being energized during the remainder of the epoch.

2. Apparatus as described in claim 1 wherein said logic means further comprises means for inhibiting said counting means during said remainder of the epoch.

3. Apparatus as described in claim 1 adapted to avionics communication apparatus wherein 25 KHz. channels are dispersed continuously in the band 118 through 147.975 MHz., wherein said segment is a given 1 MHz. range therein, said counting means operating on a periodicity of 40 pulses from said loop through a select portion of a 40 increment range, counting from the increment of the selected channel.

4. Apparatus as described in claim 3 wherein said counting means comprises:
   a first counter representing hundredths and thousandths of MHz. in accordance with the following code

| | |
|---|---|
| .X00 | 11 |
| .X25 | 01 |
| .X50 | 10 |
| .X75 | 00; | and a second counter representing tenths of MHz in accordance with the following code

| | |
|---|---|
| .0 | 1110 |
| .1 | 1101 |
| .2 | 1011 |
| .3 | 0110 |
| .4 | 1100 |
| .5 | 1000 |
| .6 | 0000 |
| .7 | 0001 |
| .8 | 0011 |
| .9 | 0111. |

5. Apparatus as described in claim 1 wherein said digitally coded representation includes separate coded designations for respective frequency increments and multiple increments, and wherein said counting means comprises separate counters corresponding to and operating in accordance with said increments and multiple increments.

6. In a communication system utilizing a specified frequency band divided into contiguous communication channels, channel selection control apparatus comprising:
   pulse frequency division means, operable in accordance with alternative first or second frequency division factors;
   means for deriving a clock signal in response to said frequency division means;
   means for selecting the frequency of a channel for communication;
   means for providing a digitally encoded representation of the selected channel;
   counting means, responsive to said clock signal and operable through a range corresponding to allocation of channels through a select fractional segment of said band, for counting through a predetermined portion of said range in proportion to the location of said encoded representation within said segment; and logic means, responsive to said counting means, for controlling said division means to operate between said first and second factors for periods corresponding to said predetermined portion of said range.

7. Apparatus as described in claim 6 wherein said means for providing comprises separate encoding means for respective orders of magnitude of frequency of the selected channel, and said counting means comprises corresponding separate counters, interconnected with one another to generate a count through said fractional segment, each counting increment being associated with a different channel in said segment.

8. Apparatus as described in claim 7 wherein said counters are programmed to initiate counting periodically, and wherein said counters are preloaded to being counting at an increment corresponding to the selected channel, and to continue counting through a set point corresponding with an extremity of said segment.

9. Apparatus as described in claim 8, wherein said logic means includes means for alternately enabling said division means to operate periodically between said factors while said counter is incrementing through said predetermined portion of said segment, and to operate with said first factor for a complementary portion of the programmed counting period of said counters.

10. Apparatus as described in claim 6 adapted to avionics communication apparatus wherein 25 KHz channels are dispersed continuously in the band 118 through 147.975 MHz, wherein said first and second factors respectively are 40 and 41, wherein said counting means operates on a periodicity of 40 clock pulses through a select portion of a 40 increment range, counting from the increment of the selected channel through the increment corresponding to 0.000 MHz, said logic means enabling said division means to operate periodically between the factors 40 and 41 while said counting means is counting from the increment of the selected channel through the maximum increment and to operate with the factor 40 during the remainder of the period of said counting means.

11. Apparatus as described in claim 10 wherein said counting means comprises:

a first counter representing hundredths and thousandths of MHz in accordance with the following code

| | |
|---|---|
| .X00 | 11 |
| .X25 | 01 |
| .X50 | 10 |
| .X75 | 00; | and a second counter representing tenths of MHz in accordance with the following code

| | |
|---|---|
| .0 | 1110 |
| .1 | 1101 |
| .2 | 1011 |
| .3 | 0110 |
| .4 | 1100 |
| .5 | 1000 |
| .6 | 0000 |
| .7 | 0001 |
| .8 | 0011 |
| .9 | 0111. |

* * * * *